United States Patent [19]

Downing

[11] Patent Number: 5,222,528
[45] Date of Patent: Jun. 29, 1993

[54] DEVICE FOR FORMING LEADS

[75] Inventor: Steven P. Downing, North Codorus, Pa.

[73] Assignee: Westinghouse Electric Corp., Pittsburgh, Pa.

[21] Appl. No.: 819,904

[22] Filed: Jan. 13, 1992

[51] Int. Cl.⁵ ............................................. B21F 1/00
[52] U.S. Cl. ...................................... 140/105; 72/26
[58] Field of Search .............................. 140/105; 72/26

[56] References Cited

U.S. PATENT DOCUMENTS

| | | |
|---|---|---|
| 4,064,917 | 12/1977 | Diaz . |
| 4,103,718 | 8/1978 | Steigerwald . |
| 4,590,660 | 5/1986 | Starski ................................ 140/105 |
| 4,644,633 | 2/1987 | Jones et al. .......................... 140/105 |
| 4,868,978 | 9/1989 | Seidel et al. . |
| 4,907,628 | 3/1990 | Corey et al. . |
| 4,941,248 | 7/1990 | Seidel et al. . |
| 5,105,857 | 4/1992 | Ellis ................................... 140/105 |

FOREIGN PATENT DOCUMENTS 30327  1/1990  Japan .................................. 72/26

Primary Examiner—Lowell A. Larson
Attorney, Agent, or Firm—David G. Maire

[57] ABSTRACT

An apparatus for forming leads having the capability to automatically measure the lead thickness and the lead exit height, and the ability to automatically adjust the lead geometry and the forces exerted on the leads to account for changes in these variables. The apparatus includes a processor which controls the clamping, forming, and shearing structures in response to input data provided by the operator and by sensors measuring variables between consecutive parts.

17 Claims, 8 Drawing Sheets

DEVICE FOR FORMING LEADS

BACKGROUND OF THE INVENTION

This invention is directed to an apparatus for forming the leads of an electrical component. More particularly, this invention involves a lead forming device which is capable of automatically accommodating a variety of component and lead geometries, and for automatically compensating for variations between consecutive parts of the same type.

Many electronic components, such as integrated circuits, have a component body with a plurality of leads extending outward from the body for connection to a printed circuit board. To facilitate surface mounting and connecting such components, the leads are often formed by being bent and trimmed to a specific configuration. Prior art devices for forming leads utilize dedicated dies. Each part size, form shape and form dimension requires a unique die set. Die sets can be very costly and they consume valuable work space. When a die is initially manufactured, the final configuration of the part is not precisely known until the die is tested. Unknowns and tolerances in dimensions, die spring constants, number of die springs, and die actuation forces can affect the final product form. It is not uncommon for dies to be reworked several times before the desired form is created. For any program that requires more than a few die sets, the cost and required work space can become prohibitive. In a development laboratory environment, where a large variety of different electronic components are handled on a low volume basis, prior art devices are particularly inadequate.

In addition to variations between types of components and desired lead geometries, there are variations on a part-to-part basis for which prior art devices do not adequately compensate. For example, variations in lead exit height and lead thickness can cause a formed component to exceed the allowable variation in standoff height, which is a critical dimension affecting both mounting integrity and heat dissipation. Prior art devices provide little flexibility in adjusting the forming die or forming process to compensate for such variables.

SUMMARY OF THE INVENTION

In light of the limitations of prior art devices, it is an object of this invention to describe a device for forming leads which eliminates the need to use a unique die set for each type of component and lead geometry desired. It is a further object of this invention to describe a forming device which is flexible in operation and which automatically compensates for variations between consecutive parts of the same type.

The invention described herein is a lead forming device having a means for automatically centering and aligning the leads to be formed, a means for automatically determining the thickness of the leads, a means for clamping the leads so that forces exerted to form the leads are not transferred to the component, a means for forming a bend in the leads, a means for automatically adjusting the bend geometry to accommodate variations in lead thickness and lead exit height, and a means for trimming the leads to the desired length. The device may include a processor for control of the clamping, forming, and shearing structures of the device. Such a processor may utilize information regarding the number of leads, the thickness of the leads, and the lead exit height to determine the geometry of the bend and the required forces for clamping, forming and shearing of the leads. The processor may also control a vacuum for removal of the trimmed lead ends.

DETAILED DESCRIPTION OF THE INVENTION

Figure 1:
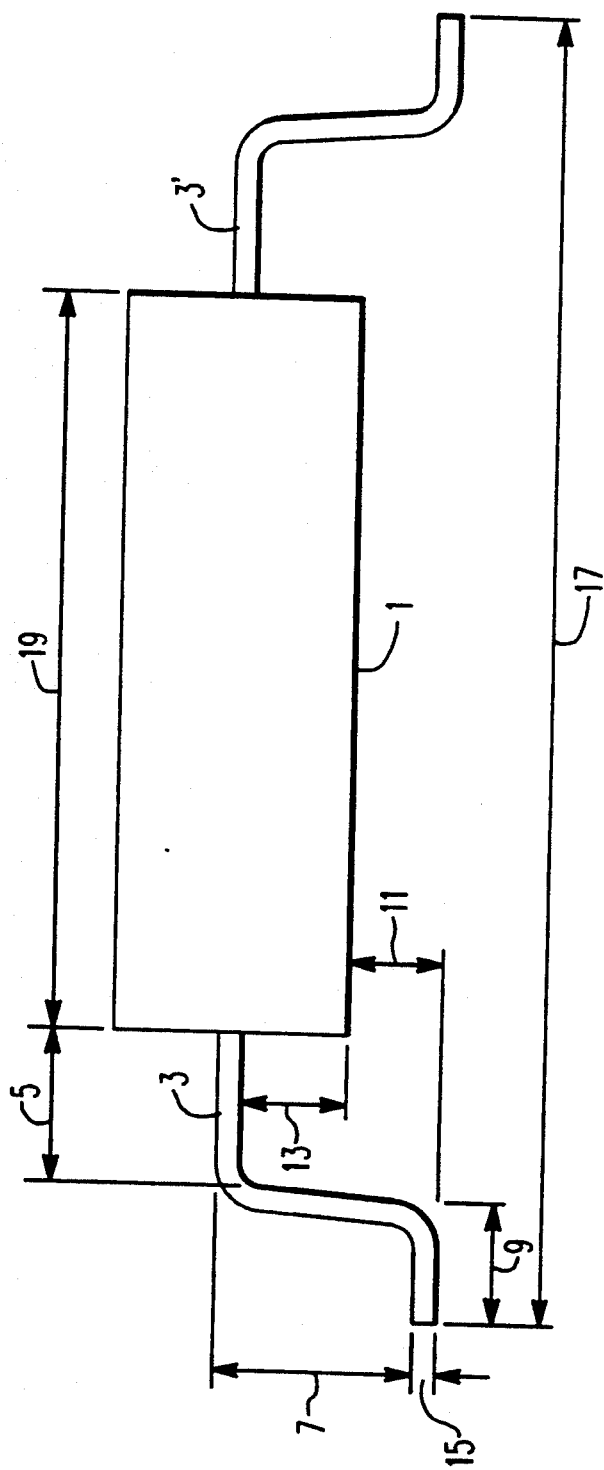
FIG. 1 is a cross sectional view of an electronic device illustrating a typical lead geometry.

A common lead configuration is the gull wing shape, as illustrated in FIG. 1, where an electronic component 1 has a lead 3 extending from the side of the component 1. The lead 3 is formed into a gull wing shape having a thigh length 5, a shin height 7, and a foot length 9. When mounted on a circuit board (not shown), the distance of the component 1 above the circuit board is the standoff height 11, which is a function of the lead exit height 13, the shin height 7, and the lead thickness 15. The total distance from the ends of opposing leads is the toe-to-toe distance 17, which is a function of foot length 9, thigh length 5 and body length 19. In most applications the component 1 has a mirror image lead 3' configured in the same manner as lead 3.

Figure 2:
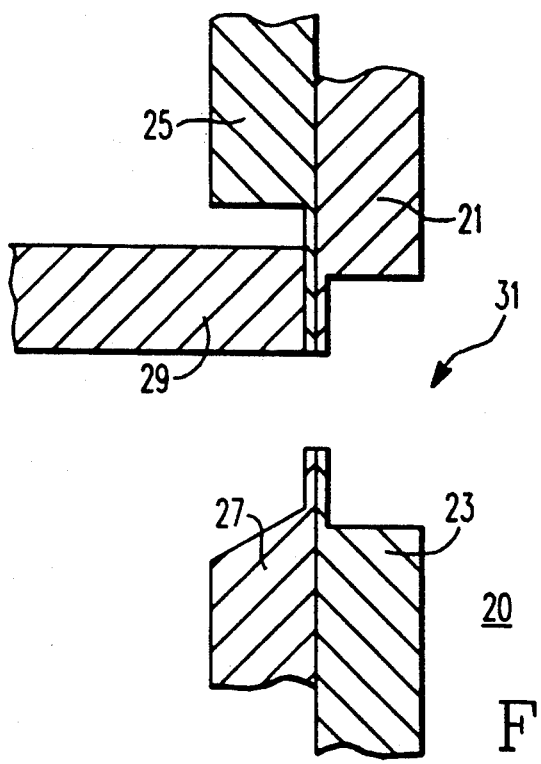
FIGS. 2 through 12 illustrate the sequence of steps performed by a lead forming device constructed in accordance with this invention.

FIGS. 2 through 12 are cross sectional views of a lead forming device 20 built in accordance with this invention illustrated at various steps in the operation of forming the leads of an electrical component 33. In FIGS. 2 through 12, identical parts are numbered identically. The device is shown in FIG. 2 in a starting position ready to receive an electrical component. Device 20 consists of a pair of mirror image die sets, with only one of the pair shown in the figure. Alternative embodiments may have any number of die sets. If only one die set is provided, the component to be formed can be rotated to form leads on more than one side of the component. Each die set contains clamping, forming and shearing structures. In the embodiment illustrated in FIGS. 2 through 12 these structures are clamping plates 21 and 23, forming plates 25 and 27, and shearing plate 29, respectively. A forming location 31 is created by the opening between the two mirror image halves of the device. The operation and cooperation of these structures will become apparent from the following description.

Figure 3:
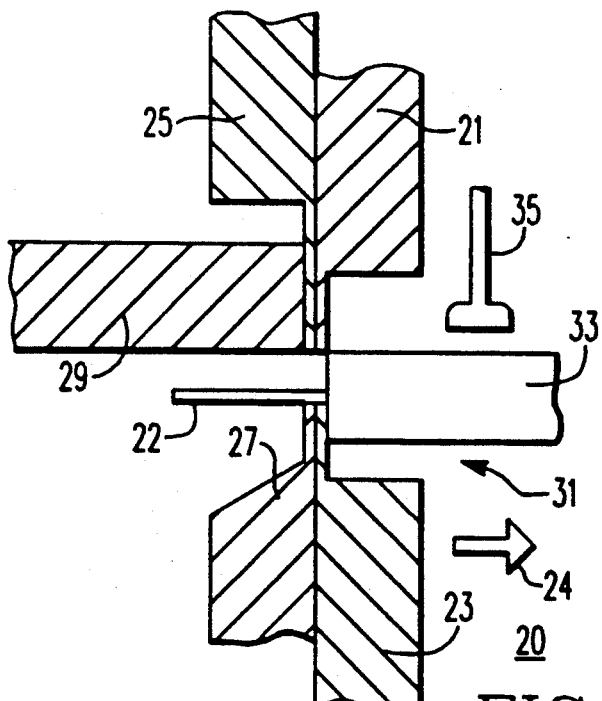

FIG. 3 illustrates lead forming device 20 as it automatically centers and aligns an electronic component 33. The component 33, typically an integrated circuit, is delivered to the forming location 31, preferably by a vacuum probe 35 or other handling device known in the art. Only one lead 22 is illustrated in the figures, with the remaining leads being parallel to the illustrated lead and located along an axis perpendicular to the plane of the figure. Once at the forming location 31, the component 33 is supported on clamping plate 23 and its mirror image counterpart (not shown), and the vacuum probe 35 is disengaged from the component 33. The two mirror image halves of the device are then moved toward each other along a first axis, typically horizontal, as indicated by arrow 24, until clamping plates 21,23 contact a side of the component 33 with preferably only a few ounces of force. This action automatically centers and aligns the component 33 at forming location 31.

Relative movement of the two halves of the lead forming device 20 can be accomplished with a single motor by driving the two mirror image die sets in opposite directions along the first axis by means of counter rotating ball screws.. mounted on a linear slide. The use of a single motor provides the advantage of ensuring that the die sets move symmetrically about a center forming location 31, thus facilitating placement and alignment of component 33.

The amount of force exerted by clamping plates 21, 23 during the automatic centering and aligning step of FIG. 3 is preferably small. When the two mirror image die sets are driven by a single motor through counter rotating ball screws, this can be accomplished by mounting one of the ball nuts to the linear slide through an air cylinder. During the centering and aligning process of FIG. 3, the air pressure in this cylinder is reduced such that the air cylinder will break away with only a few ounces of force. Movement of the air cylinder can be sensed and the movement of the motor immediately stopped. During other operations of the forming device, the air pressure in the cylinder is increased to provide essentially a solid coupling.

Figure 4:
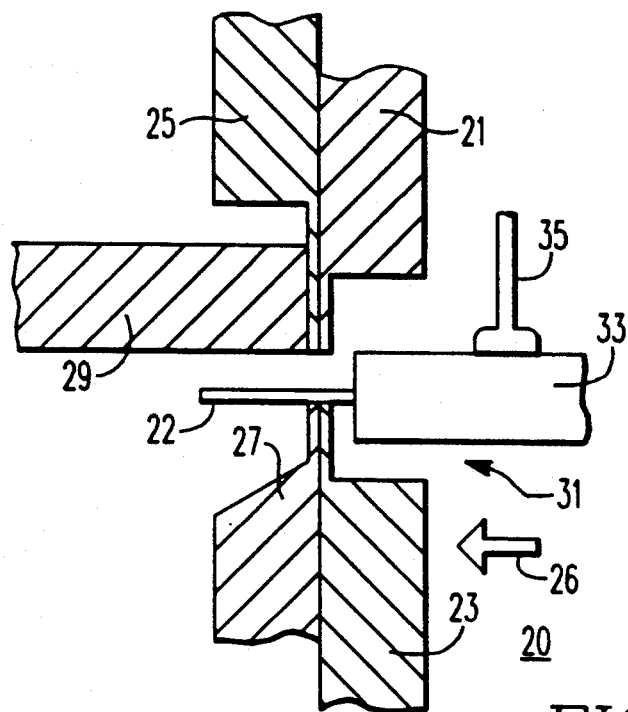

FIG. 4 illustrates the lead forming device 20 as it adjusts for the desired toe-to-toe dimension. Vacuum probe 35 is utilized to support the component 33 in the centered and aligned position as the two halves of the device 20 are moved apart along the first axis, as indicated by arrow 26, to the required form dimension. This action establishes the thigh length of the formed leads.

Figure 5:
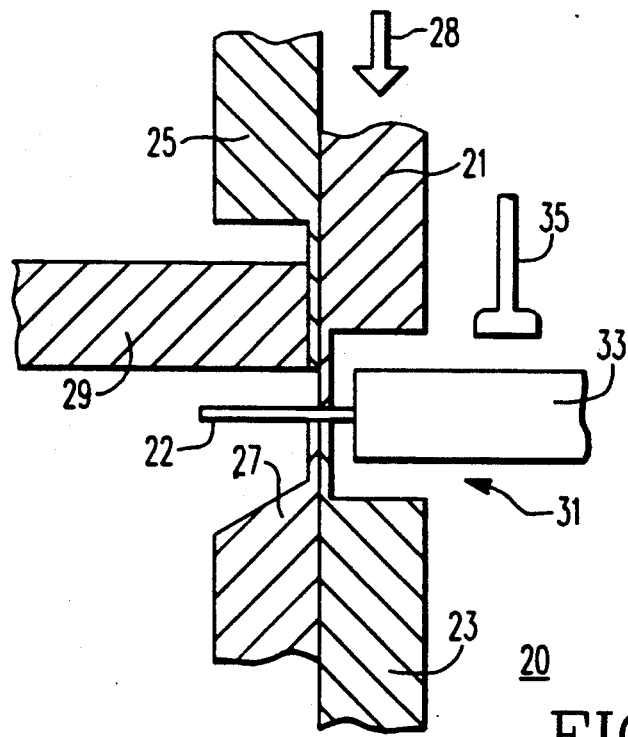

FIG. 5 illustrates the clamping of the leads to be formed. Once the clamping plates 21, 23 are positioned in the proper location along the first axis, clamping plate 21 is moved along a second axis, typically vertical, as indicated by arrow 28, until it clamps lead 22 against clamping plate 23. At this time vacuum probe 35 is disengaged and the component is support solely by the clamping plates 21, 23 and their mirror image plates (not shown). In this manner all forces imposed on the leads during the bending process are transferred into the clamping structure, thereby isolating the body of the component 33 from such forces.

Figure 6:
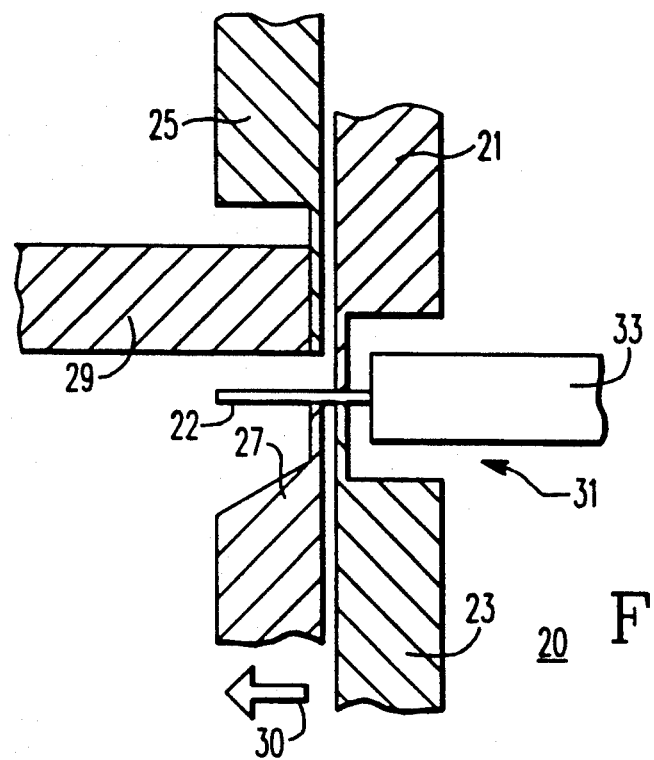

FIG. 6 illustrates the movement of the forming structure, i.e. forming plates 25, 27, away from the clamping plates 21, 23, in the direction of arrow 30, to adjust for the lead thickness. The thickness of lead 22 can be automatically measured by sensing the distance between clamping plates 21 and 23 when they are in the clamped position illustrated in FIG. 5. The movement illustrated in FIG. 6 allows the location of the forming plates 25, 27 to be adjusted to account for variations in the thickness of lead 22. Thicker leads require a larger gap between the forming plates 25, 27 and the clamping plates 21, 23 to achieve a proper bend geometry. The angle of the bend between the thigh and the shin is also affected by this movement. Here, again, it is preferable to drive mirror image die sets with a single motor to ensure precise operation.

Once the forming plates 25, 27 are properly positioned along the first axis, forming plate 27 is moved along the second axis to a position which corresponds to the proper shin height for the bend. In the embodiment illustrated in FIG. 7, forming plates 25, 27 move jointly in the direction of arrow 32 to this position. The motor which drives this movement may also drive the mirror image plates. This action is followed in FIG. 8 by forming plate 25 moving independently in the direction of arrow 34 to form the bend in lead 22. As forming plate 25 forces the lead downward, it deforms against forming plate 27. The result is a bend in lead 22 having a shin height determined by the relative location of forming plate 27 with respect to forming location 31. Clamping plates 21, 23 remain closed against the leads during this process to isolate the body of component 33 from the forming forces.

Figure 9:
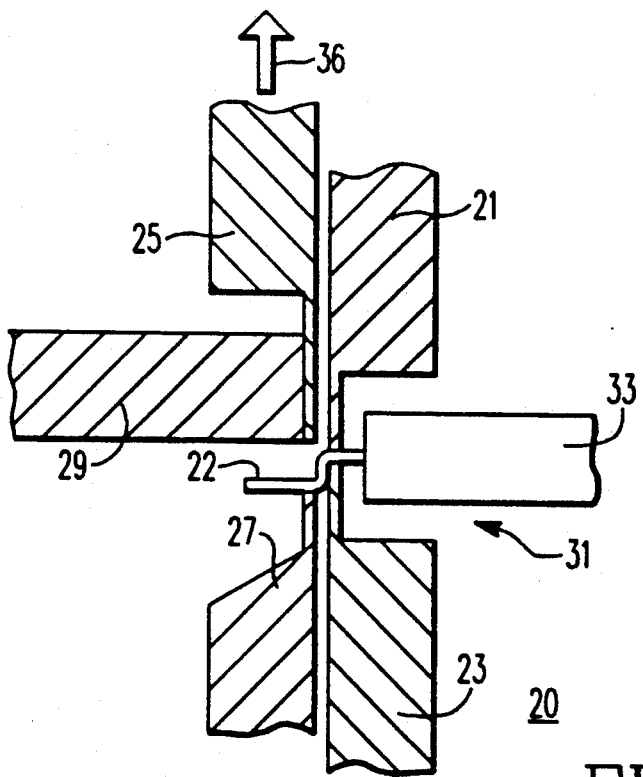
Figure 10:
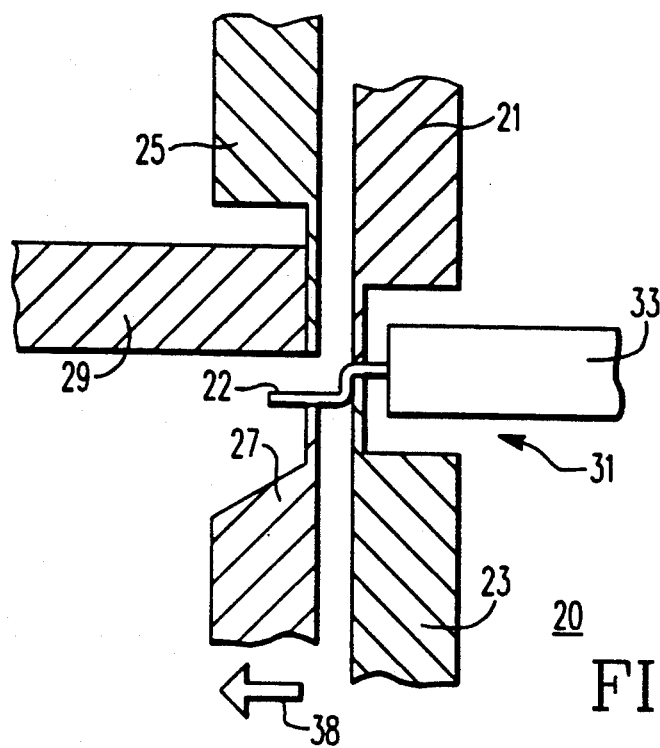
Figure 11:
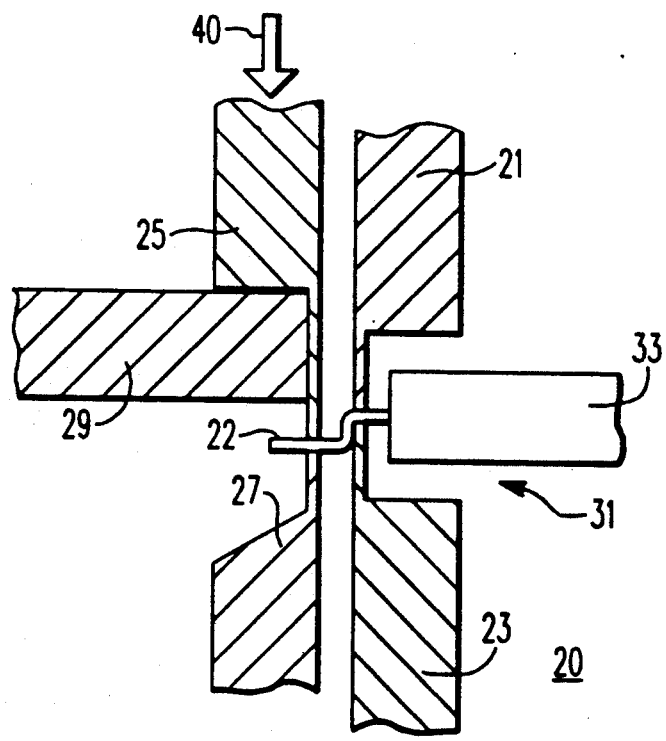
Figure 12:
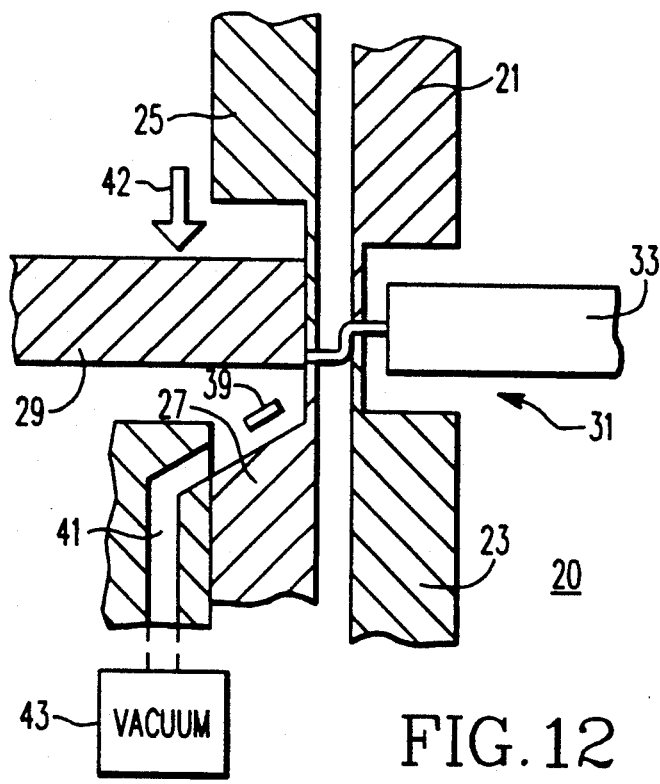

Forming plate 25 then reverses its motion to release the lead 22, as shown by arrow 36 in FIG. 9. The forming plates 25, 27 and shearing plate 29 then move jointly to the desired position for trimming the length of the leads, as illustrated by arrow 38 in FIG. 10. Forming plate 25 again clamps lead 22 against forming plate 27, as shown by arrow 40 in FIG. 11, to provide mechanical support for the trimming operation. Shearing plate 29 trims lead 22 to the desired length by moving in the direction of arrow 42 as shown in FIG. 12.

It is important in a lead forming device 20 to properly handle the trimmed lead end 39 so that it does not interfere with the proper action of the device. In the embodiment illustrated in FIG. 12, a cavity area 41 is provided for collection of the lead end 39. The cavity area 41 is connected to a vacuum 43 which draws air through the cavity area 41 thereby sweeping the lead end 39 away from the forming device 20. Since static control is very important whenever electronic components are being handled, and because even the movement of air can cause a detrimental static charge to accumulate over time if the part is not properly grounded, the vacuum 43 is preferably operated in cooperation with the shearing movement of trimming plate 29. In this manner, air movement is provided only when it is required to remove the lead end 39, and only when the component is clamped and thereby properly grounded and shielded.

FIGS. 2 through 12 illustrate, by way of example, a device which bends the leads of an electronic component into the common gull wing shape. Other configurations of bends may also be accomplished by devices built in accordance with this invention. Furthermore, lead material and shim stock which is not part of an electronic component may also be formed by such a device.

Figure 13:
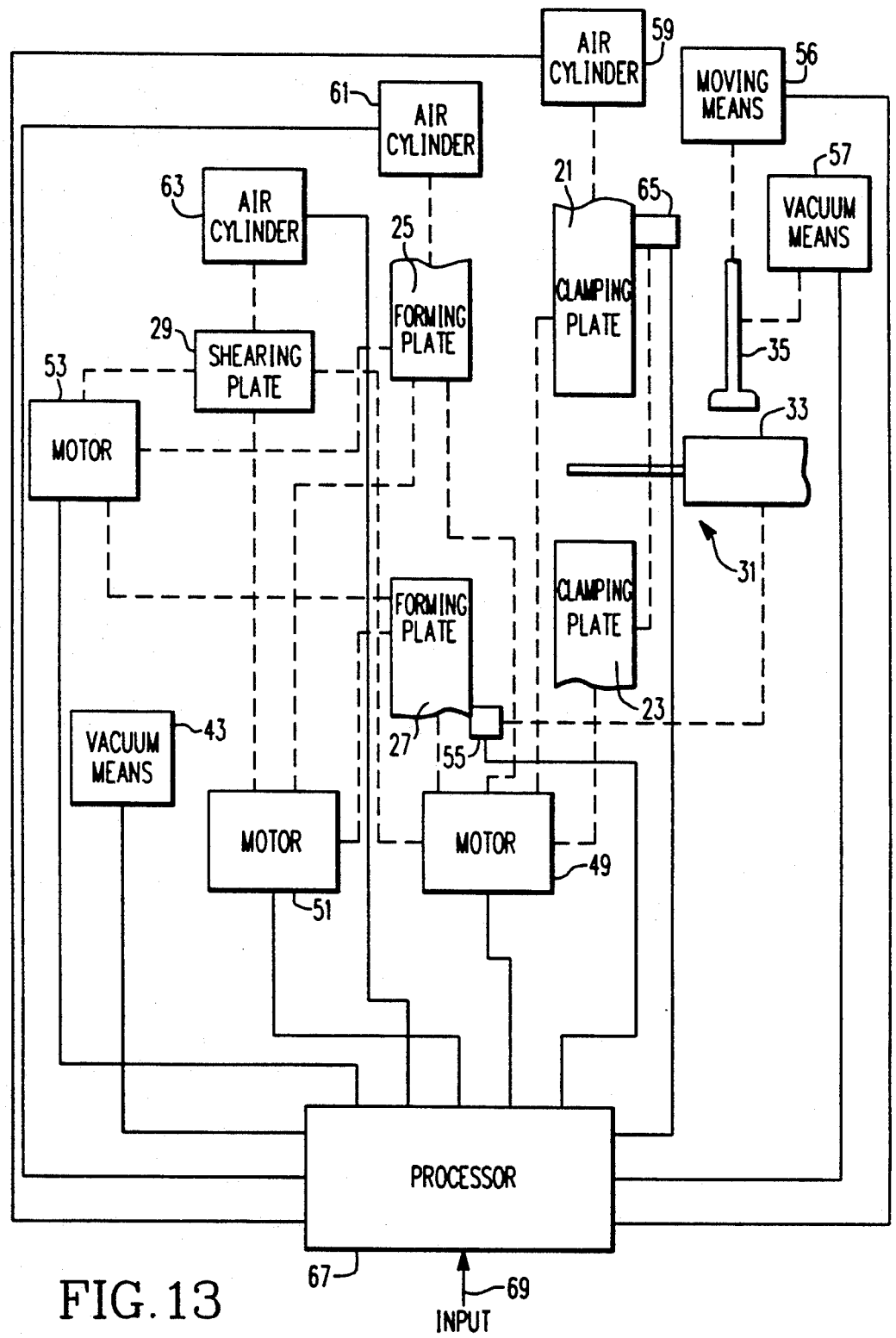
FIG. 13 is a schematic illustration of the interconnection of the various electrical and mechanical parts of a lead forming device constructed in accordance with this invention.

The flexibility and precision of lead forming device 20 illustrated in FIGS. 2 through 12 is complemented by its ability to utilize inputs regarding the component to be formed and the desired lead geometry, as well as its ability to sense variables between consecutive parts and to adjust the forming process accordingly. The relationship of elements of this invention is illustrated in schematic form in FIG. 13, where the structures of the lead forming device are numbered consistently with FIGS. 2 through 12. In FIG. 13, electrical interconnections are represented by solid lines and mechanical interconnections are represented by dashed lines.

In FIG. 13, a means for moving plates 21, 23, 25, 27, and 29 jointly as a unit in the horizontal direction is shown as item 49. A mirror image means for moving the mirror image plates (not shown) may also be provided to operate in cooperation with moving means 49. Moving means 49 is operated during the centering and aligning steps illustrated in FIGS. 3 and 4. A means for moving plates 25, 27 and 29 jointly as a unit in the horizontal direction is shown as item 51. Moving means 51 is operated during the step illustrated in FIG. 6 where the forming plates 25, 27 are positioned to accommodate variations in the lead thickness. A means for moving plates 25, 27 and 29 jointly as a unit in the vertical direction is shown as item 53. This moving means 53 is operated during the step illustrated in FIG. 7 when the shin height is set. In one embodiment, moving means 49, 51 and 53 are stepper motors which provide highly accurate control over the position of the various plates.

Figure 7:
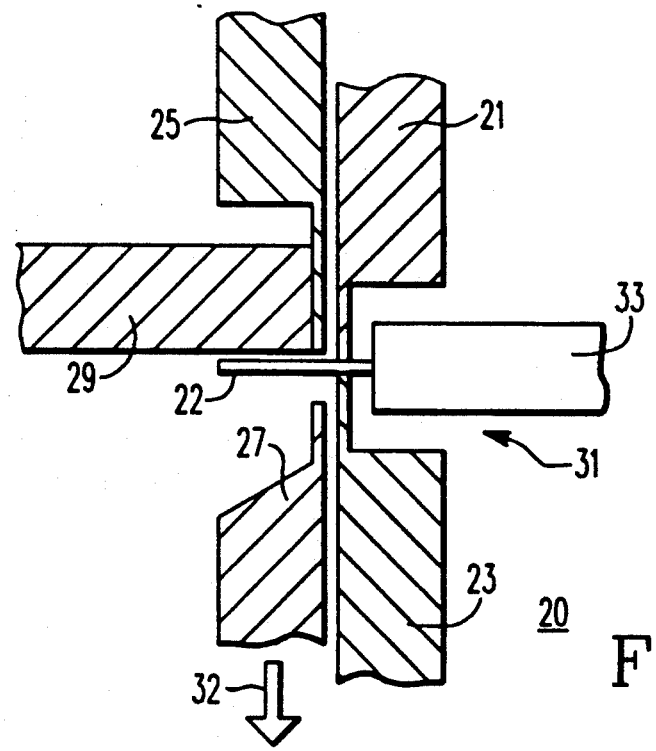
Figure 8:
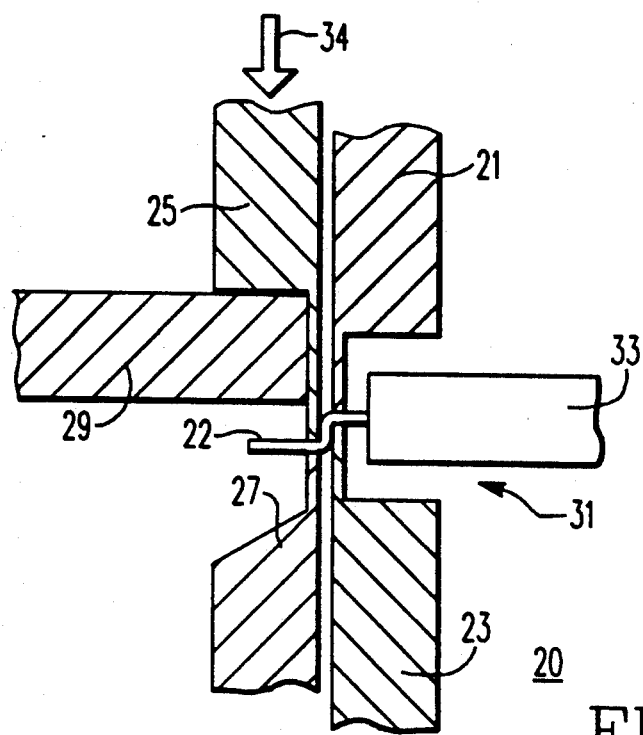

A means for automatically adjusting the bend geometry for variations in lead exit height requires a direct or indirect measurement of the lead exit height for each component to be formed. FIG. 13 illustrates an indirect measuring technique which can be used to adjust the movement of forming plates 25, 27 to automatically account for variations in lead exit height. Item 55 of FIG. 13 is a measuring device such as a linear variable inductor (LVI) transducer attached to forming plate 27 and operable to measure the distance between forming plate 27 and the bottom of the electronic component 33. Because this measurement is a direct measurement of standoff height, it is independent of variations in lead exit height from component to component. Therefore, when the movement of forming plates 25, 27 in FIG. 7 is controlled as a function of the measurement from LVI 55, the bend geometry is automatically adjusted for variations in lead exit height.

A motor or other means for moving the vacuum probe 35 is shown schematically in FIG. 13 as item 56. Moving means 56 operates to deliver the electronic part to the forming location 31, and to withdraw the vacuum probe 35 from the forming location 31 once the vacuum means 57 has been de-energized. Moving means 56 can be an electric motor.

Means for moving clamping plate 21 in the vertical direction is shown as item 59. This moving means 59 is operated in the step illustrated in FIG. 5 where the leads are clamped between plates 21 and 23. A means for moving plate 25 in the vertical direction is shown as item 61. This moving means 61 is operated in the step illustrated in FIG. 8 where the leads are bent, as well as the steps illustrated in FIGS. 9 and 11 where the plates are positioned for the shearing step. Means for moving shearing plate 29 in the vertical direction is shown as item 63. This moving means 63 is operated in the step illustrated in FIG. 12 where the leads ends are trimmed. Moving means 59, 61 and 63 can be air cylinders whose force can be varied by the control of programmable air regulators. In this manner, the force to be applied for clamping, forming and shearing the leads can be adjusted to accommodate variations in lead quantities, lead thickness, and lead material. The force may be transferred from the air cylinders to the plates by means of cables working against return springs. The use of cables allows the top of the plates to remain clear of obstructions, thus facilitating interface of the forming device with other fixtures in a robotic work cell environment.

A means for determining lead thickness is shown as item 65 which is preferably an LVI connected to plate 21 and operable to measure the distance between plates 21 and 23.

An electronic processor 67 serves to receive input signals and to provide the necessary control signals for this lead forming device. The processor 67 may be a personal computer or microcomputer with the necessary interface devices. User input data 69 is provided to describe the type of component being formed and the desired lead configuration, for example component length, standoff height, toe-to-toe dimension, foot length, number of leads, lead material, etc. Such input can be entered manually by the operator or can be provided by interface with other work station devices. The processor 67 controls the various device moving means to accomplish the sequence of steps illustrated in FIGS. 2 through 12. Inputs are utilized by the processor 67 to adjust the position of the various plates to achieve the desired final lead form geometry. For example, the position of the forming plates 25, 27 can be adjusted by the processor 67 during its control of moving means 51 to account for the actual lead thickness, as measured by LVI 65. Input from LVI 55 is utilized by the processor to control stepper motor 51 in order to adjust the thigh length of the lead to automatically account for variations in lead exit height. The amount of force exerted by vertical moving means 59, 61, 63 can be controlled by processor 67 in response to input regarding the number of leads, the lead material, and the thickness of the leads. When this force is provided by air cylinders, the processor 67 provides a control signal for the programmable air regulators. The position and movements of the stepper motors 49, 51, 53 is also controlled by the processor 67. The processor can also monitor variables in order to provide statistical data or alarms for the operator. In this manner, a highly flexible and precise lead forming device is achieved to satisfy the objects of this invention.

The above description is provided as an illustration of the invention and should not be interpreted as limiting the scope of the invention as claimed below.

I claim:

1. A device for forming leads of an electronic component comprising:
    means for automatically centering and aligning said component at a forming location;
    means for automatically determining the thickness of said leads;
    means for clamping said leads so that forces exerted to bend said leads are not transferred to said component;
    means for forming a bend in said leads;
    means for automatically adjusting the distance between said means for clamping and said means for forming as a function of lead thickness;
    means for trimming said leads.

2. A device as in claim 1, further comprising a means for adjusting the geometry of said bend as a function of lead exit height.

3. A device as in claim 2, wherein said means for forming a bend comprises forming structures operable to move in the direction of a first axis to adjust the geometry of said bend as a function of lead thickness, and operable to move in the direction of a second axis to bend said leads.

4. A device as in claim 3, wherein said means for automatically adjusting the geometry of said bend as a function of lead exit height comprises a transducer operable to determine a distance between said forming structures and a surface of said component.

5. A device as in claim 3, wherein said trimming means comprises a shearing structure operable to move in the direction of said second axis.

6. A device as in claim 1, wherein said means for clamping comprises clamping structures.

7. A device as in claim 6, wherein said clamping structures are operable to move along a first axis to automatically center and align said component at said forming location.

8. A device as in claim 6, wherein said clamping structures are operable to move in the direction of a second axis to clamp said leads.

9. A device as in claim 6, wherein said means for automatically measuring the thickness of said leads comprises a transducer operable to determine a distance separating said clamping structures.

10. A device as in claim 1, further comprising means for automatically controlling the force exerted for clamping of said leads as a function of the number of leads.

11. A device as in claim 1, further comprising means for automatically controlling the force exerted for forming said bend as a function of thickness of said leads and the number of said leads.

12. A device as in claim 1, further comprising a vacuum means for removing the trimmed ends of said leads, wherein said vacuum means is operable only in cooperation with said trimming means.

13. A device for bending the leads of an electronic component comprising:
    clamping plates operable to move in the direction of a first axis to align and center said component at a forming location and operable to move in the direction of a second axis to clamp said leads;
    forming plates operable to move in the direction of said second axis to form a bend in said leads and operable to move in the direction of said first axis and said second axis to adjust the geometry of said bend, wherein said clamping plates isolate said electronic component from the forces exerted by said forming plates;
    a shearing plate operable to move in the direction of said second axis to trim said leads;
    a first transducer operable in cooperation with said clamping plates to determine the thickness of said leads;
    a processor having input from said first transducer, and having output operable to control the movement of said clamping, forming and shearing plates, said processor operable to adjust the geometry of said bend in response to said input signals.

14. A device as in claim 13, wherein said processor is operable to control the force exerted by said clamping, forming and shearing plates as a function of the thickness of said leads.

15. A device as in claim 13, further comprising a second transducer operable to determine a distance between said forming plates and a surface of said component, wherein said processor is operable to adjust the geometry of said bend in response to a signal from said second transducer.

16. A device as in claim 13, wherein the number of leads is input to said processor and said processor is operable to control the forces applied by said clamping, forming and shearing plates as a function of said number of leads.

17. A device as in claim 13, further comprising a vacuum means operable to remove from said device the trimmed ends of said leads, said vacuum means being controlled by said processor to operate only in cooperation with said shearing plate.

* * * * *